United States Patent
Lee et al.

[11] Patent Number: 6,165,884
[45] Date of Patent: Dec. 26, 2000

[54] METHOD OF FORMING GATE ELECTRODE IN SEMICONDUCTOR DEVICE

[75] Inventors: Sang Moo Lee, Kyoungki-do; Hyeon Soo Kim, Kyoungsangbuk-do; In Seok Yeo, Kyoungki-do, all of Rep. of Korea

[73] Assignee: Hyundai Electronics Industries Co., Ltd., Kyoungki-do, Rep. of Korea

[21] Appl. No.: 09/457,162

[22] Filed: Dec. 8, 1999

[30] Foreign Application Priority Data

Dec. 22, 1998 [KR] Rep. of Korea .................. 98-57252

[51] Int. Cl.7 .................................. H01L 21/3205
[52] U.S. Cl. .................... 438/592; 438/595; 438/663; 438/664; 438/655
[58] Field of Search .................. 438/592, 595, 438/655, 663, 664

[56] References Cited

U.S. PATENT DOCUMENTS

| | | | |
|---|---|---|---|
| 4,833,099 | 5/1989 | Woo | 427/239 |
| 5,364,803 | 11/1994 | Lur et al. | 437/40 |
| 5,484,743 | 1/1996 | Ko et al. | 437/44 |
| 5,500,249 | 3/1996 | Telford et al. | 427/255 |
| 5,643,633 | 7/1997 | Telford et al. | 427/255 |
| 5,665,203 | 9/1997 | Lee et al. | 438/585 |
| 5,723,893 | 3/1998 | Yu et al. | 257/413 |
| 5,736,455 | 4/1998 | Iyer et al. | 438/655 |
| 5,796,151 | 8/1998 | Hsu et al. | 257/410 |
| 5,858,868 | 1/1999 | Hirade | 438/597 |
| 5,888,588 | 3/1999 | Nagabushnam et al. | 438/592 |
| 5,895,244 | 4/1999 | Wu | 438/655 |
| 5,937,300 | 8/1999 | Sekine et al. | 438/300 |
| 6,028,002 | 2/2000 | Thakur | 438/655 |
| 6,046,090 | 4/2000 | Wu | 438/303 |
| 6,060,741 | 5/2000 | Huang | 257/315 |
| 6,069,044 | 5/2000 | Wu | 438/299 |
| 6,100,188 | 8/2000 | Lu et al. | 438/653 |

FOREIGN PATENT DOCUMENTS

| | | | |
|---|---|---|---|
| 10027902 | 1/1980 | Japan | H01L 29/78 |
| 04336466 | 11/1992 | Japan | H01L 29/784 |
| 05347272 | 12/1993 | Japan | H01L 21/28 |
| 09246206 | 9/1997 | Japan | H01L 21/28 |
| 09293865 | 11/1997 | Japan | H01L 29/78 |
| 10163206 | 6/1998 | Japan | H01L 21/3205 |

*Primary Examiner*—John F. Niebling
*Assistant Examiner*—Lynne Gurley
*Attorney, Agent, or Firm*—Ladas & Parry

[57] ABSTRACT

A method of forming a gate electrode in a semiconductor device which can easily perform etching process for forming the gate electrode and reduce the resistivity of a gate electrode, is disclosed. In the present invention, a gate oxide layer, an amorphous silicon layer and a tungsten silicide layer are sequentially formed on a semiconductor substrate. A mask oxide pattern is then formed on the tungsten silicide layer in the shape of a gate electrode. Next, the tungsten silicide layer and the amorphous silicon layer are etched using the mask oxide pattern as an etch mask, to form a gate electrode. Thereafter, the amorphous silicon layer and the tungsten silicide layer of the gate electrode are thermal-treated by RTP spike annealing and an oxide layer is then formed on the side wall of the gate electrode. According to the present invention, by reducing resistivity of a tungsten silicide layer, it is possible to apply a conventional gate electrode material to high integration device over 1GDRAM, thereby lowering cost to develop a new gate electrode material. Furthermore, etching process for forming a gate electrode is easily performed when using the tungsten silicide layer as the gate electrode material, thereby obtaining uniform gate electrode. As a result, the reliability of a device is improved.

7 Claims, 3 Drawing Sheets

METHOD OF FORMING GATE ELECTRODE IN SEMICONDUCTOR DEVICE

BACKGROUND OF THE INVENTION

1. Field of the Invention

The present invention relates to a method of forming a gate electrode in a semiconductor device, and more particularly to a method of forming a gate electrode in a semiconductor which can easily perform etching process for forming the gate electrode and reduce the resistivity of a gate electrode, when utilizing the tungsten silicide as the gate electrode material.

2. Description of the Related Art

In high integration device over 64 MDRAM, a CVD tungsten(W) silicide layer is generally used as a gate electrode material. Particularly, a dichlorsilane(DCS) tungsten silicide is widely used than a monosilan(MS) tungsten silicide as the gate electrode material considering GOI property, since the former is smaller in content of fluorine(F) impurities than the latter. However, it is difficult to apply the DCS tungsten silicide to high integration device over 1 GDRAM, because of its high resistivity.

To solve the problem, a method of forming a gate electrode of a polycide structure having a low resistivity using rapid thermal process(RTP) spike annealing, is proposed. In the method, a tungsten silicide layer of W-rich is deposited on an amorphous silicon layer. RTP spike annealing is then performed to react the amorphous silicon with the tungsten. Thereafter the tungsten silicide layer and the amorphous silicon layer are etched to form the gate electrode of the polycide structure.

However, in the method, there is problem that the amorphous silicon layer is transformed into a polysilicon layer by RTP spike annealing prior to forming the gate electrode. Furthermore, the crystal of tungsten silicide is transformed from hexagonal structure to tetragonal structure having grain of a large size during RTP spike annealing, so that the interface between the polysilicon layer and the tungsten silicide becomes inconsistent. As a result, it is difficult to perform etching for forming the gate electrode and a gate oxide layer under the gate electrode is completely removed during the etching, thereby deteriorating the reliability of a device.

SUMMARY OF THE INVENTION

It is therefore an object of the present invention to provide a method of forming a gate electrode in a semiconductor device which can easily perform etching process for forming the gate electrode, for solving the problems in the conventional art.

It is another object of the present invention to reduce the resistivity of a gate electrode.

To accomplish the above objects, according to the present invention, a gate oxide layer, an amorphous silicon layer and a tungsten silicide layer are sequentially formed on a semiconductor substrate. A mask oxide pattern is then formed on the tungsten silicide layer in the shape of a gate electrode. Next, the tungsten silicide layer and the amorphous silicon layer are etched using the mask oxide pattern as an etch mask, to form a gate electrode. Thereafter, the amorphous silicon layer and the tungsten silicide layer of the gate electrode are thermal-treated by RTP spike annealing and an oxide layer is then formed on the side wall of the gate electrode.

Furthermore, the tungsten silicide layer is formed with the ratio of Si:W being lower than prior art.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained with reference to accompanying drawings.

In the present invention, for easily performing etching process for forming a gate electrode, RTP spike annealing is performed after forming the gate electrode. Furthermore, to reduce the resistivity of the gate electrode, a tungsten silicide layer is formed with the ratio of Si:W being lower than prior art.

Figure 1:
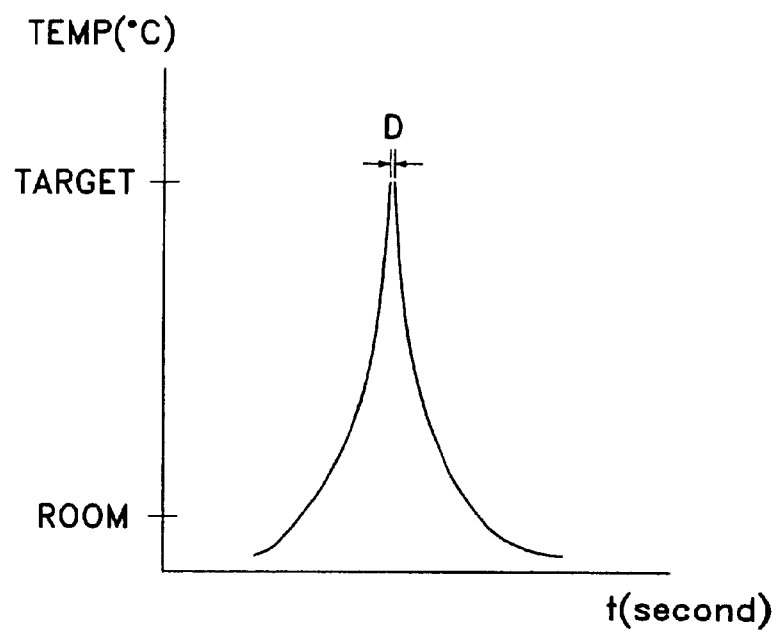
FIG. 1 is a graph showing feature of RTP spike annealing.

FIG. 1 is a graph of time(t)-temperature(TEMP) showing feature of RTP spike annealing. RTP spike annealing is thermal-treating process to lower temperature without delay time after raising temperature from room temperature (ROOM) to target temperature(TARGET) for short time, as shown in FIG. 1. Furthermore, in RTP spike annealing, ramping rate is 150° C./sec or more, the delay time(D) is 1 second or less and the target temperature(TARGET) is 950 to 1,500° C.

Figure 2A:
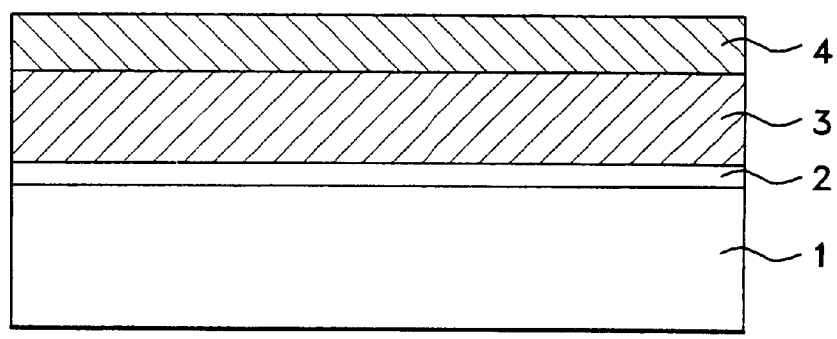
FIG. 2A to FIG. 2C are cross sectional views for describing a method of forming a gate electrode in a semiconductor device according to an embodiment of the present invention.
Figure 2B:
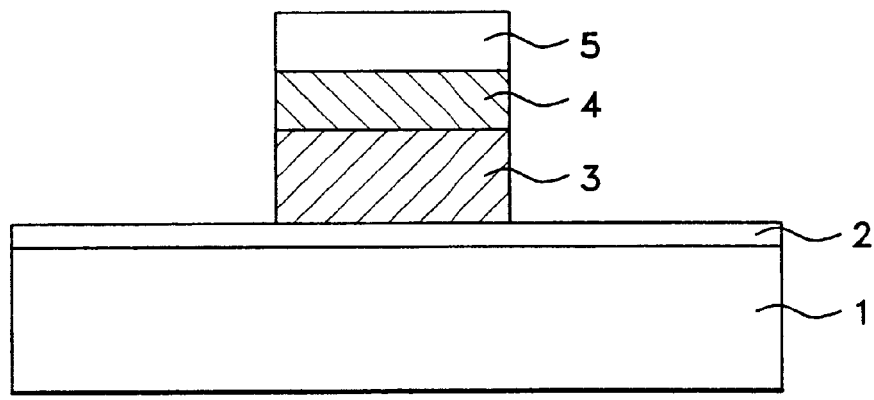
Figure 2C:
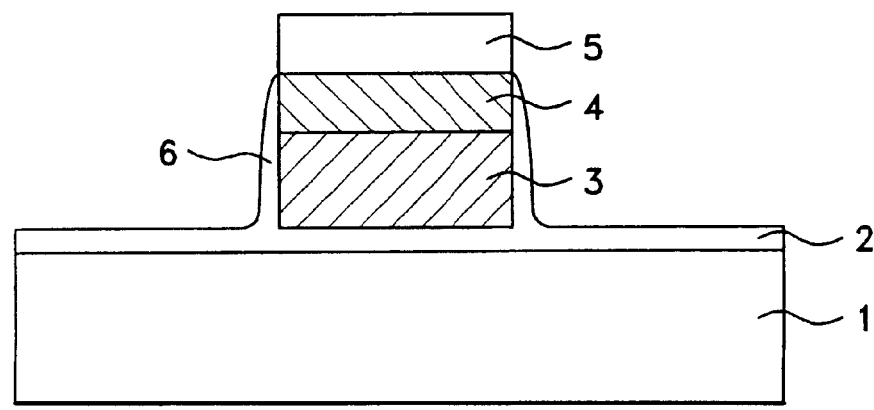

FIG. 2A to FIG. 2C are cross sectional views describing a method of forming a gate electrode in a semiconductor device according to an embodiment of the present invention.

Referring to FIG. 2A, a gate oxide layer 2, an amorphous silicon layer 3, and a tungsten silicide layer 4 of DCS are sequentially formed on a semiconductor substrate 1 by in-situ. Preferably, the tungsten silicide layer 4 of DCS is formed by chemical vapor deposition(CVD) using DCS ($SiH_2Cl_2$) gas and $WF_6$ gas, with the ratio of Si:W being lower than prior art, preferably, the ratio of 1:1 to 2:1.

Furthermore, the amorphous silicon layer 3 and the tungsten silicide layer 4 are formed by adding or subtracting the thickness, considering the thickness decrease of the amorphous silicon layer 3 and the thickness increase of the tungsten silicide layer 4 due to reaction of the amorphous silicon and the tungsten when performing RTP spike annealing subsequently. Preferably, the amorphous silicon layer 3 is formed to the thickness of 1,000 to 1200 Å, and the tungsten silicide layer 4 is formed to the thickness of 800 to 1000 Å.

Referring to FIG. 2B, an oxide layer is formed on the tungsten silicide layer 4 by plasma enhanced CVD(PECVD) and patterned using a mask(not shown) to a mask oxide pattern 5. The tungsten silicide layer 4 and the amorphous silicon layer 3 are then etched using the mask oxide pattern 5 as an etch mask to form a gate electrode.

Sequentially, the amorphous silicon layer 3 and the tungsten silicide layer 4 of the gate elctrode are thermal-treated by RTP spike annealing as described in FIG. 1. Preferably, RTP spike annealing is performed to the delay time of 0.1 to 1.0 second, the ramping rate of 150 to 250° C./sec and the temperature in the delay time of 950 to 1,200° C. under $N_2$ or $NH_3$ gas atmosphere. At this time, since the amorphous silicon reacts with the tungsten silicide, so that the thickness of the amorphous silicon layer 4 decreases, the amorphous silicon layer is formed to the thickness being 200 to 300 Å thicker than that of a polysilicon layer required after performing RTP spike annealing. Furthermore, the more and more the thickness of the amorphous silicon layer is thick, it is easy to etch the amorphous silicon layer.

Therefore, in case the amorphous silicon layer is thickly formed as described above, the etching for forming the gate electrode is easily performed.

Referring to FIG. 2C, an oxide layer 6 is formed on the side wall of the gate electrode by $O_2$ oxidation process.

Figure 3A:
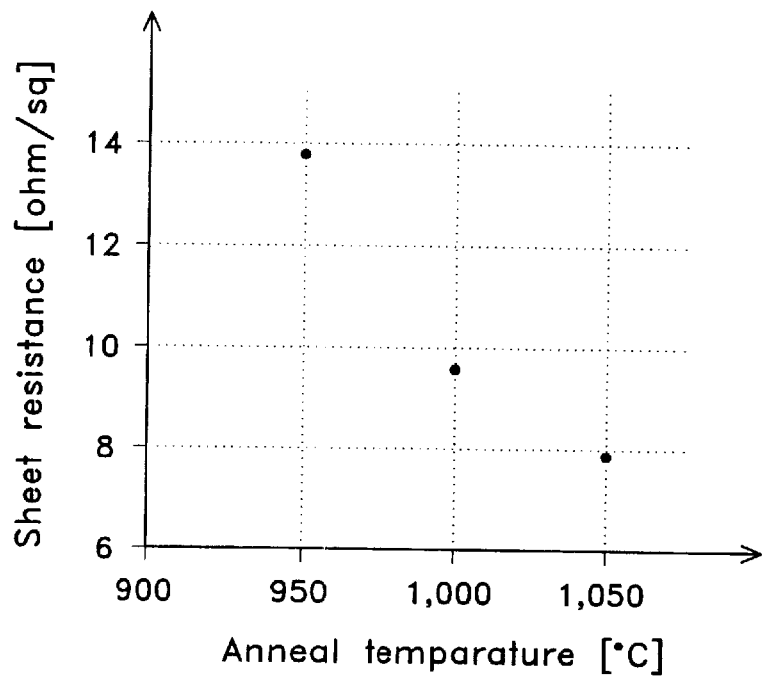
FIG. 3A to FIG. 3B are graphs showing a sheet resistance of tunsten silicide according to the conventional art and the present invention.
Figure 3B:
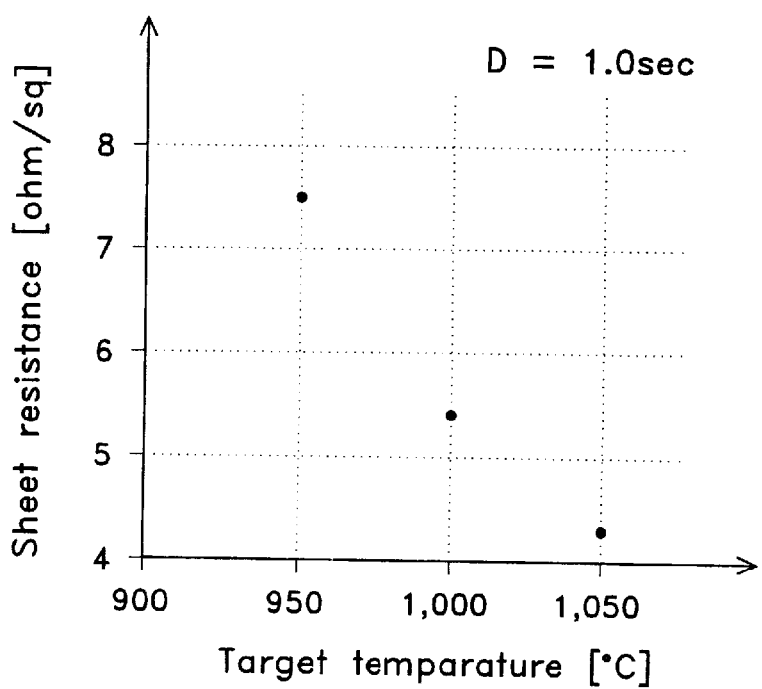

FIG. 3A to FIG. 3B are graphs showing a sheet resistance of tunsten silicide according to the conventional art and the present invention.

Referring to FIG. 3A, the tungsten silicide 4 whose thickness is 1,000 Å, has a sheet resistance of 13.8(ohm/sq), 9.6(ohm/sq), and 7.9(ohm/sq) respectively, when performing a conventional RTP annealing in $NH_3$ ambient at the anneal temperature of 950° C., 1,000° C., and 1050° C.

Referring to FIG. 3B, the tungsten silicide 4 whose thickness is 1,000 Å, has a sheet resistance of 7.5(ohm/sq), 5.4(ohm/sq), and 4.3(ohm/sq) respectively, when performing a RTP spike annealing at the target temperature of 950° C., 1,000° C., and 1050° C. with delay time(D) of 1.0 sec.

According to the present invention, by reducing resistivity of a tungsten silicide layer, it is possible to apply a conventional gate electrode material to high integration device over 1 GDRAM, thereby lowering cost to develop a new gate electrode material.

Furthermore, etching process for forming a gate electrode is easily performed when using the tungsten silicide layer as the gate electrode material, thereby obtaining uniform gate electrode. As a result, the reliability of a device is improved.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode in semiconductor device, comprising the steps of:

forming a gate oxide layer, an amorphous silicon layer and a tungsten silicide layer on a semiconductor substrate, in sequence;

forming a mask oxide pattern on the tungsten silicide layer in the shape of a gate electrode;

etching the tungsten silicide layer and the amorphous silicon layer using the mask oxide pattern to form a gate electrode;

thermal-treating the amorphous silicon layer and the tungsten silicide layer of the gate electrode by RTP spike annealing; and forming an oxide layer on the side wall of the gate electrode.

2. The method according to claim 1, wherein the ratio of Si:W in the tungsten silicide is 1:1 to 2:1.

3. The method according to claim 1, wherein the RTP spike annealing is performed to the delay time of 0.1 to 1.0 seconds, the ramping ratio of 150 to 250° C./sec and the temperature in the delay time of 950 to 1,200° C. under $N_2$ or $NH_3$ gas atmosphere.

4. The method according to claim 1, wherein the gate oxide layer, the amorphous silicon layer and the tungsten silicide layer are formed by in-situ.

5. The method according to claim 1, wherein the tungsten silicide layer is formed by chemical vapor deposition using $DCS(SiH_2Cl_2)$ gas and $WF_6$ gas.

6. The method according to claim 1, wherein the amorphous silicon layer is formed to the thickness of 1,000 to 1,200 Å.

7. The method according to claim 1, wherein the tungsten silicide layer is formed to the thickness of 800 to 1,000 Å.

* * * * *